United States Patent [19]

Pan et al.

[11] Patent Number: 5,326,794

[45] Date of Patent: Jul. 5, 1994

[54] BARBITURIC ACID-MODIFIED BISMALEIMIDE WITH DIAMINE AND POLYISOCYANATE-MODIFIED EPOXY RESIN

[75] Inventors: Jing-Pin Pan, Hsinchu; Chuen-Chyr Chen, Taichung; Gwo-Yuh Shiau; Ker-Ming Chen, both of Hsinchu, all of Taiwan

[73] Assignee: Industrial Technology Research Institute, Taiwan

[21] Appl. No.: 911,692

[22] Filed: Jul. 10, 1992

Related U.S. Application Data

[63] Continuation-in-part of Ser. No. 520,465, May 8, 1990, abandoned.

[51] Int. Cl.$^5$ ............. C08L 63/02; C08L 63/04; C08L 63/06; C08K 5/07
[52] U.S. Cl. .................. 523/454; 525/502; 525/526; 525/527; 525/528
[58] Field of Search ............ 523/454; 525/527, 526, 525/528, 502

[56] References Cited

U.S. PATENT DOCUMENTS

| | | | |
|---|---|---|---|
| 4,107,153 | 8/1978 | Akiyama et al. | 525/530 |
| 4,294,877 | 10/1981 | Graham | 525/527 |
| 4,401,777 | 8/1983 | Tsuboi et al. | 525/422 |
| 5,041,519 | 8/1991 | Pan et al. | 528/102 |

*Primary Examiner*—Robert E. Sellers
*Attorney, Agent, or Firm*—Bacon & Thomas

[57] ABSTRACT

A process for manufacturing a high glass transition temperature printed circuit board comprising blending a modified bismaleimide resin into a modified epoxy resin is disclosed. Particularly the material is manufactured by blending a bismaleimide resin reacted with barbituric acid and its derivative thereof and an epoxy resin with an oxazolidone ring resulting from the reaction of a polyisocyanate and an epoxy resin modified with a secondary diamine and followed by curing. The resultant product has a high glass transition temperature, a good adhesion, flame retardancy, and a low bromine content.

2 Claims, No Drawings

BARBITURIC ACID-MODIFIED BISMALEIMIDE WITH DIAMINE AND POLYISOCYANATE-MODIFIED EPOXY RESIN

This is a continuation-in-part application of U.S. Ser. No. 07/520,465 filed May 8, 1990, now abandoned.

BACKGROUND OF THE INVENTION

Present commercially available resin laminating material for printed circuit boards is predominantly a bifunctional epoxy. However, the potential for a resin of this type to be utilized in a multilayer circuit board is limited because of the inherent shortcomings of bifunctional epoxy such as a low glass transition temperature (Tg) value of approximately 130 Centigrade (C) of FR-4, a poor heat resistance, a high thermal expansion coefficient and other deficiencies.

U.S. Pat. No. 4,284,877 discloses adding bismaleimide (BMI) resin to increase the Tg value of the resin formula. Bismaleimide triazine (BMT) resin also may be added to increase the Tg value of the resin formula. A drawback to this combination is that BMI resin becomes highly fragile after curing. A second drawback is that if used directly, the material is not strong enough. In the process of blending an epoxy with a BMI resin, though the Tg may be raised, after curing, the material becomes very fragile and is unfavorable for processing because of the BMI.

Next, due to the poor adhesion between BMI resin and copper foil or glass fiber, if BMI is incorporated with a polyfunctional epoxy the peel strength will decrease. An article in 5 Int. J. Adhesive and Adhesives No. 3, at 123 (July 1985) further reported that when BMI resin was added to soft rubber which modified the fragile BMI resin, adverse phenomena such as phase separation of the curing mass resulted.

To correct the drawbacks of the addition of a BMI resin, a material with a more flexible molecular structure may be introduced into a BMI resin to increase the resiliency when cured, but the resultant composition is often associated with a low Tg. See 15 Brit. Polym. J. at 2 (March 1983); British Pat. No. 1,190,718.

Finally, to achieve flame retardant standards, it is beneficial to use a flame retardant containing bromine in a conventional epoxy resin. Resin containing bromine however often exhibits a poor thermal utility. See 9 IEEE Transaction of Components, Hybrids and Man. Tech. No. 4 at 37 (December 1986); J. Macromol Sci. Chem. A. 5(7) at 1205-18 (November 1971).

For resolving the aforementioned deficiencies, the present invention discloses that through adding a modified BMI resin to a modified epoxy resin the resulting resin may maintain a high Tg value as well as the characteristics of excellent processing properties, good adhesion, flame retardancy, low bromine content and the like.

The present invention discloses a process for modifying both a BMI resin and an epoxy resin. These modified resins are then combined resulting in a varnish which can be compressed into a circuit board exhibiting the beneficial qualities enumerated above.

SUMMARY OF THE INVENTION

A process for manufacturing a high glass transition temperature (Tg) printed circuit board comprises blending a bismaleimide (BMI) resin modified with barbituric acid (BTA) and its derivatives into an epoxy resin modified with both polycyanate resin and secondary diamine, and finally dissolving the modified BMI resin, the modified epoxy resin and a curing agent.

A characteristic aspect of the present invention relates to a laminating resin prepared for a printed circuit board having a high Tg, good toughness, good adhesiveness, easy processing and a low bromine content.

DETAILED DESCRIPTION OF THE PREFERRED EMBODIMENTS

The starting materials used in the present invention include the following:
(a) polyisocyanate;
(b) epoxy resin;
(c) BMI resin
(d) barbituric Acid (BTA) and its derivatives;
(e) curing agent; and
(f) secondary diamine.

The starting materials will be described in detail as follows, respectively.

Typical examples of starting material a) used in the invention are:

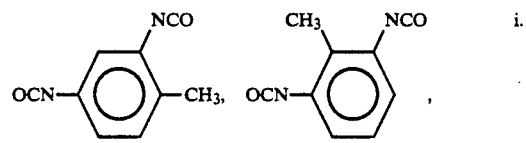

i.

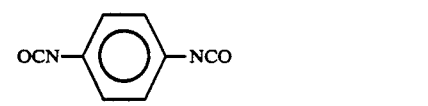

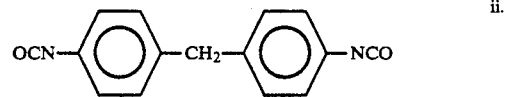

ii.

iii.

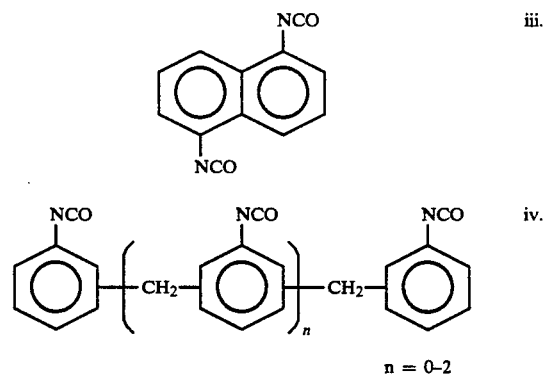

iv.

n = 0-2 or

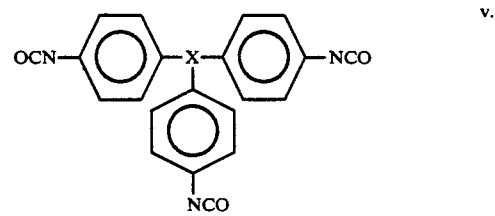

v.

where X is: 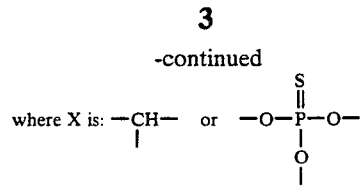

Starting material b):

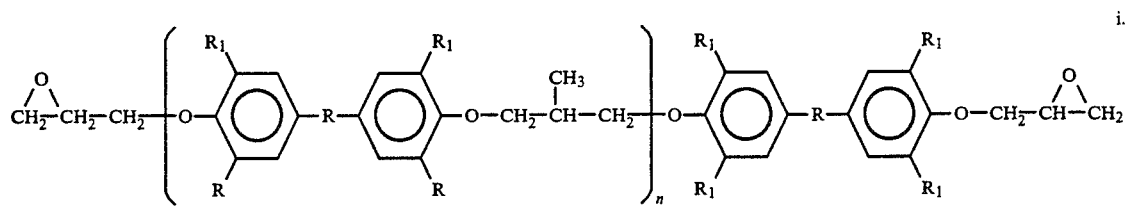

Where R = C 1-4 alkyl group, R₁ = H or Br and
n = 0-2 epoxy equivalent 150-575

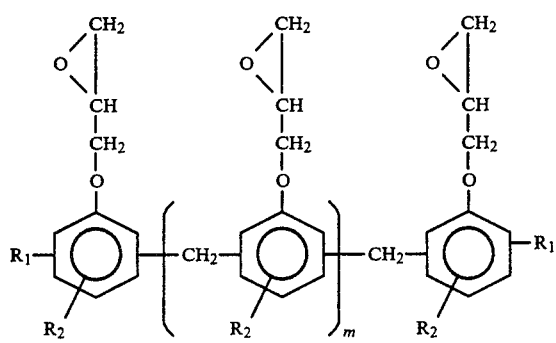

R₁ = H or CH₃, R₂ = H or Br and
n = 1-4 epoxy equivalent 150-350

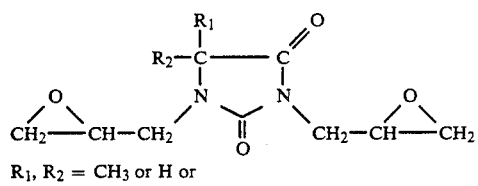

R₁, R₂ = CH₃ or H or

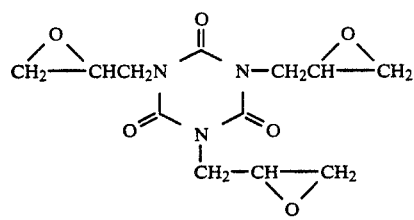

Starting material c):

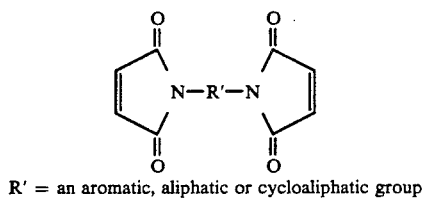

R' = an aromatic, aliphatic or cycloaliphatic group

Examples of typical bismaleimides are is follows:
N,N'-ethylene-bis-maleimide
N,N'-butylene-bis-maleimide
N,N'-hexamethylene-bis-maleimide
N,N'-phenylene-bis-maleimide
N,N'-4,4'-diphenyl methane-bis-maleimide
N,N'-4,4'-diphenyl ether-bis-maleimide
N,N'-4,4'-diphenyl sulfone-bis-maleimide
N,N'-4,4'-dicyclohexyl methane-bis-maleimide
N,N'-xylylene-bis-maleimide
N,N'-diphenyl cyclohexane-bis-maleimide and the like.

Starting material d):

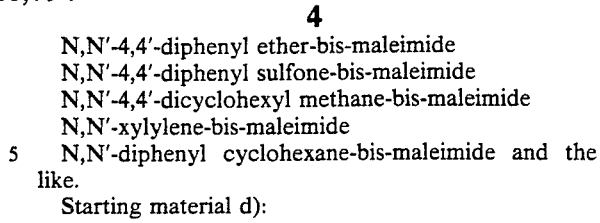

i.

ii.

iii.

v.

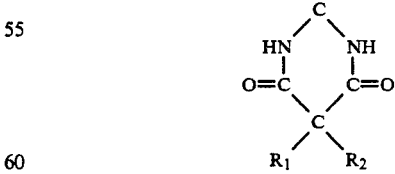

R₁, R₂: —H; —CH₃, —C₂H₂, —C₆H₅, —CH(CH₃)₂
—CH₂CH(CH₃)₂, —CH₂CH₂CH(CH₃)₂,

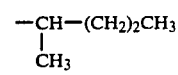

Starting material e): Examples of typical diamines are as follows:
ethylene diamine.
propylene diamine.
tetramethylene diamine.
pencamethylene diamine.
hexamethylene diamine.
2-ethylhexylene diamine.
nonametylene diamine.
2,11-diamine-dodecane and the like
meta-phenylene diamine.
para-phenylene diamine.
2,2'-naphthylene diamine.
4,4'-biphenylene diamine.
methylene dianillne-(4,4'-diaminodiphenyl methane).
ethylene dianiline-(4,4'-diaminodiphenyl ethane).
propylene dianiline-(4,4'-diaminodiphenyl propane).
and the like;

bis-(para-amino-cyclohexyl)N-phenyl amine.
bis-(para-amino-cyclohexyl)N-methyl amine.
hexailuoroisopropylidene-bis-(4-phenyl amine).
4,4'-diamino-diphenyl methane.
4,4'-diamino-diphenyl ethane.
4,4'-diamino-diphenyl propane
4,4'-diamino-diphenyl butane.
2,6-diamino-pyridine.
bis-(4-amino-phenyl)diethyl saline.
bis-(4-amino-phenyl)diphenyl saline.
bis-(4-amino-phenyl)ethyl phosphine oxide.
bis-(4-amino-phenyl)phenyl phosphine oxide.
bis-(4-amino-phenyl)-N-phenylamine.
bis-(4-amino-phenyl)-N-methylamine.
3,3'-dimethyl-4,4'-diamino-biphenyl.
2,4-bis(b-amino-(-butyl)toluene.
bis-(para-b-amino-(-butyl-phenyl)ether.
para-bis-(2-methyl-4-amino-phenyl)benzene.
para-bis-(1.1-dimethyl-5-amino-pentyl)benzene.
m-xylylene diamine.
p-xylylene diamine.

oxydianillne-(4,4'-diaminodiphenylether)
ketodianiline.
4,4'-diamino-diphenyl sulfide.
3,3'-diamino-diphenyl sulfide.
4,4'-diamino-diphenyl sulfone.
3,3'-diamino-diphenyl sulfone.
bis-(para-amino-cyclohexyl)methane.
bis-(para-amino-cyclohexyl)ethane.
bis-(para-amino-cyclohexyl)propane.
bis-(para-amino-cyclohexyl)sulfide.
bis-(para-amino-cyclohexyl)sulfone.
bis-(para-amino-cyclohexyl)ether.
bis-(para-amino-cyclohexyl)diethyl silane.
bis-(para-amino-cyclohexyl)diphenyl silane.
bis-(para-amino-cyclohexyl)ethyl phosphine oxide.
bis-(para-amino-cyclohexyl)phenyl phosphine oxide.

1,2-bis-(3-amino-propoxy)ethane.
2,2-dimethyl propylene diamine.
3-methoxy-hexamethylene diamine.
2.5-dimethylheptamethylene diamine.
3-methylnonametylene diamine.
1,4 diamino-cyclohexane.
1,2-diamino-octadecane.
2,5-diamino-1,3,4-oxadiazole.
Starting material f):

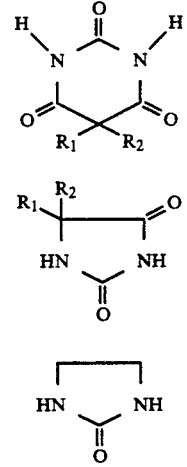

$R_1$ and $R_2 = H$, $CH_3$, $C_2H_5$ or $C_6H_5$.

A general preparing procedure according to the present invention is as follows:

1) BMI and BTA or its derivatives in a molar ratio of 7.5-1.3 moles of BMI per 1 mole of BTA or its derivatives is added into an appropriate amount of a solvent and reacted at a temperature of 115°-145° C. or 100°-130° C. for 0.5 to 1.5 hours or 0.5 to 1.0 hours. The solvent may be a cosolvent containing butrolactone and methyl ethyl ketone (MEK) having a weight ratio of butrolactone to methyl ethyl ketone of from 5:1 to 3:1. The cosolvent is 0.7-0.9 times that of the BMI.

2) An epoxy resin is reacted with a secondary diamine at 110°-150° C. in the presence of a tertiary amine catalyst for 1 to 5 hours wherein the molar ratio of secondary diamine/epoxy is from 0.0-0.5 moles of secondary diamine per one mole of epoxy.

3) Into the product from 2) a polyisocyanate is added, the equivalent ratio of isocyanate/epoxy being from 0.3-0.8 equivalents of isocyanate per equivalent of epoxy. The resin so modified is dissolved in a cosolvent as in 1) above at a ratio of 0.75-0.95 times the weight of the cosolvent. The cosolvent may have a ratio of 0.25-0.35 parts butyrolactone to 1.0 part MEK. The resultant is reacted for 3 to 8 hours at 100°-150° C. or 130°-160° C.

4) A curing agent in an amount of epoxy equivalent in the epoxy/curing agent ratio of 1.0-1.2 and a solvent in a suitable amount are added and stirred and cooked at 50°-85° C., preferably at 70° C., for 0.5-1.5 hours.

5) Mix the product of each from 1) and 4) in a ratio by weight of 1)/4) of 0.25/1 to 5.0/1, preferably 0.3/1 to 3.0/1, at 70°-130° C. for 0.5-1.5 hours, preferably 0.5-1.0 hours, with stirring to give the prepreg liquid of the instant invention.

EXAMPLE 1 i) 150 g of N, N'-4, 4'-diphenyl methane-bis-maleimide is dissolved in a cosolvent comprising 24 g of MEK and 96 g of gamabutyrolactone and then 17.8 g of BTA is added therein. The mixture is heated at 120° C. for 0.5 hour with stirring.

ii) 135.2 g of Dow DER 332 and 28 g of Dow DER 552 are added into a mixture of 9 g of 5, 5-dimethyl hydantion and 0.7 g of N, N-dimethyl benzylamine and then the mixture is raised to 140° C. and kept for 2 hours, then 55.4 g of MDI and 0.24 g of tetra ethyl aminomium bromide are added. Following elevating the temperature to 150° C. for 3 hours and cooling to 100° C. a cosolvent of 149.1 g MEK and 44.7 g butyrolactone is added thereinto and dissolved completely.

iii) 23.3 g of diamino diphenyl sulfone (DDS) dissolved in the solution of ii) is heated at a temperature of 70° C. for 0.5 hour with stirring. Then the resultant is added into the mixture of i) and stirred at a temperature of 70° C. for 1 hour.

iv) A B stage prepreg is made of the varnish and a 7628 glass cloth is compressed at 200° C. under 350 psi for 1.5 hour. The laminate of 1.6 mm thick is provided. See Table 1.

EXAMPLE 2 i) 150 g of N, N'-4, 4'-diphenyl methane-bis-maleimide is dissolved in a cosolvent comprising 24 g of MEK and 96 g of gamabutyrolactone which is 0.7–0.9 times the weight of the BMI. The ratio by weight of butyrolactone to MEK may be 5–3. Then 26.8 g of barbituric acid is added therein. The mixture is heated at a temperature between 100°–130° C., preferably 120° C., for 0.5–1.0 hour, preferably 0.5 hour, with stirring to form a first product.

ii) 314.6 g of Dow DER 3312 and 104.4 g of Dow DER 552 are added into 14.7 g of barbituric acid and reacted for 3 hours at 145° C. 97.7 g of TDI and 0.3 g of hexamethylene tetraamine are added. Following reacting at a temperature of 150° C. for 3 hours and cooling to 100° C. a cosolvent of 163.5 g MEK and 49 g butyrolactone is added thereinto and dissolved completely at a temperature of 100° C.

iii) 23.3 g of DDS dissolved in the solutio of ii) is heated at a temperature 70° C. for 0.5 hour with stirring. Then the resultant is added into the mixture of i) and stirred at a temperature of 70° C. for 1 hour.

iv) A B stage prepreg made of the varnish and a 7628 glass cloth is compressed at 200° C. under 350 psi for 1.5 hour. The laminate of 1.6 mm thick is provided. See Table 1.

COMPARATIVE EXAMPLE 1 i) 150 g of N, N'-4, 4'-diphenyl methane-bis-maleimide is dissolved in 100 ml of butyrolactone and then 17.8 g of barbituric acid is added. The mixture is heated at 130° C. for an hour while stirring.

ii) 189.1 g of Dow DER 3312 and 39 g of Dow DER 542 are added into 150 ml of methyl methoxy ethanol. After dissolving the solution is added into the mixture of i) and kept at 130° C. for 0.5 hour.

iii) Into the product of ii) 55.2 g of DDS is added and also 120 ml of acetone and 45 ml of MEK and the mixture is stirred at 60° C. for 0.5 hour.

iv) B stage prepreg made of the varnish and a 7628 glass cloth is compressed at 200° C. under 350 psi for 1.5 hour. A laminate of 1.6 mm thick is obtained. See Table 1.

COMPARATIVE EXAMPLE 2 i) 150 g of N, N'-4, 4'-diphenyl methane-bis-maleimide is dissolved in 100 ml of butyrolactone and then 26.8 g of barbituric acid is added. The mixture is heated at 130° C. for 1 hour while stirring.

ii) 399.1 g of Dow DER 331 and 133 g of Dow DER 542 are added into 150 ml of methyl methoxy ethanol. After dissolving the solution is added into the mixture of i) and kept at 130° C. for 0.5 hour.

iii) Into the product of ii) 125 g of DDS is added and also 250 ml of acetone and 90 ml of MEK and the mixture is stirred at 60° C. for 1 hour.

iv) B stage prepreg made of the varnish and a 7628 glass cloth is compressed at 200° C. under 350 psi for 1.5 hour. A laminate of 1.6 mm thick is obtained. See Table 1.

TABLE I

Properties of a Laminated Board

| Item | Unit | Condition Method | Exp 1 | Exp 2 | Comparative Example 1 | Comparative Example 2 | IPC:GPW | Conventional FR-4 |
|---|---|---|---|---|---|---|---|---|
| Tg | °C. | TNA | 224 | 205 | 220 | 203 | >220 | 130 |
| Peel Strength | lb/in | 25° C. | 9 | 9.5 | 6.5 | 7.5 | 5 | 10 |
| | | 170° C. | 7.2 | 7.4 | 5 | 5.7 | 5 | 4 |
| Dielectric Constant (1 MHz) | — | ASTM-150 | 4.5 | 4.5 | 4.6 | 4.5 | 5.4 | 4.7 |
| Bromine Content (Containing Glass) | % | | 1.5 | 3.2 | 2.2 | 4.0 | — | 11 |
| Volume Resistance | Ohmn-Cm | ASTM-257 | $2 \times 10^{14}$ | $1.8 \times 10^{14}$ | $1.2 \times 10^{14}$ | $0.9 \times 10^{14}$ | $6 \times 10^{10}$ | $1 \times 10^{14}$ |
| Surface Resistance | Ohmn | ASTM-257 | $2.1 \times 10^{12}$ | $2 \times 10^{12}$ | $1.1 \times 10^{12}$ | $1 \times 10^{12}$ | $6 \times 10^{10}$ | $1 \times 10^{12}$ |
| Z direction Expansion (25-246° C.) | % | | 0.9 | 1.4 | 0.89 | 1.44 | <2.6 | >5 |
| Moisture Absorption | % | ASTM-570 | .40 | .39 | .45 | .40 | — | .35 |
| Flamibility | — | UL-94 | UL-94 -V0 | UL-94 -V0 | UL-94 -V0 | UL-94 -V0 | — | UL-94 -V0 |

What is claimed:

1. A process for manufacturing resins for use in a high glass transition temperature printed circuit board comprising:
dissolving bismaleimide in a cosolvent of butyrolactone/methyl ethyl ketone wherein the weight of the cosolvent is 0.7 to 0.9 times that of the bismaleimide and the ratio by weight of butyrolactone/methyl ethyl ketone is from 5:1 to 3:1, and then adding a barbituric acid or its derivative whereby said bismaleimide undergoes reaction with said barbituric acid, the reaction of said bismaleimide with said barbituric acid being carried out at a temperature between 100° and 130° C. for about 0.5 to 1 hour to form a first product;
dissolving an epoxy resin modified with a secondary diamine and polyisocyanate into 0.75 to 0.95 times by weight of a cosolvent of butyrolactone-methyl ethyl ketone having a ratio by weight of butyrolactone/methyl ethyl ketone of 0.25/1 to 0.35/1 at a temperature between 100° to 150° C. and then cooling to about 50° to 85° C., adding a curing agent dissolved in a solvent to form a first solution, adding said first solution into said first product and then stirring for 0.5 to 1.5 hour at a temperature of about 70° to 130° C. to produce the resins.

2. A process according to claim 1 wherein the ratio of the weight of first product to the weight of the first solution equals 0.25:1 to 3.0:1.

* * * * *